Jan. 29, 1963 M. C. AGENS 3,075,855

COPPER PLATING PROCESS AND SOLUTIONS

Filed March 31, 1958 3 Sheets-Sheet 1

Inventor:
Maynard C. Agens,
by Paul A. Frank
His Attorney.

Inventor:
Maynard C. Agens,
by Paul A. Frank
His Attorney.

Jan. 29, 1963 M. C. AGENS 3,075,855

COPPER PLATING PROCESS AND SOLUTIONS

Filed March 31, 1958 3 Sheets-Sheet 3

Inventor:
Maynard C. Agens,
by Paul A. Frank
His Attorney.

3,075,855

COPPER PLATING PROCESS AND SOLUTIONS

Maynard C. Agens, Schenectady, N.Y., assignor to General Electric Company, a corporation of New York Filed Mar. 31, 1958, Ser. No. 725,449
16 Claims. (Cl. 117—47)

Figure 1:
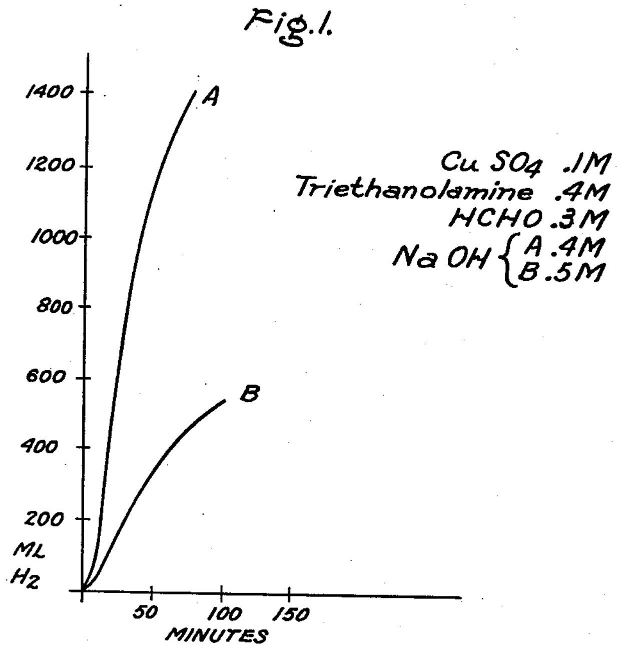

The present invention relates to a copper plating process and solution. More particularly the invention relates to an autocatalytic chemical reduction process and a bath for plating the desired thickness of copper on objects having an active metallic surface. Still more particularly, this invention relates to an autocatalytic chemical reduction process and bath for plating the desired thickness of copper on objects having a catalytic metallic surface without simultaneously causing the plating of undesired surfaces and/or the precipitation of cuprous oxide from the solution.

Previously it has been necessary to electroplate copper onto the surface of objects when it was desired to produce a relatively thick coating. While this method of copper plating is satisfactory for many purposes, it is objectionable in that it requires the use of rather elaborate and somewhat expensive electrical equipment, and close control of the bath composition while being used. When it is desired to copper plate a non-metallic object such as a molded laminated or otherwise shaped article containing thermoplastic or thermosetting resin, it is necessary to provide the plastic with a special conducting coating prior to the electroplating process. In the latter application if there are discontinuous areas to be plated it is necessary to provide an electrical contact to each one of the separate areas. In the making of printed circuit boards, where there are many isolated areas on a single board to be plated, such a procedure is very time consuming and expensive. Furthermore, when electroplating articles with sharp edges the electroplated copper tends to form a heavier coat at the sharp edges than it does on the plane surfaces. Also, it is very difficult to electroplate the walls of the holes. These difficulties are obviated by the use of the copper plating process and solutions forming the subject matter of this application.

There are known techniques of obtaining flash coatings on chemical plated copper. However these techniques utilize chemical solutions which decompose spontaneously during the plating process. In order to obtain any substantial thickness of copper plate by these known techniques, it requires a great number of such flash coatings. Because the chemicals and the solutions used in these techniques are spent in forming each flash coating, the procedure is wasteful of chemicals and hence too costly. Such a process not only plates the desired object with copper but also any other surfaces which are in contact with the solution during the plating operation including the container walls. Furthermore, a great deal of the copper in the solution is precipitated as cuprous oxide rather than plated as copper. These reactions are wasteful of the chemicals in the copper plating solution.

Copending application of A. E. Cahill et al. Serial No. 610,401, filed September 17, 1956, and assigned to the same assignee as the present invention, now U.S. 2,874,072, discloses and claims in electroless method of copper plating wherein copper ion, complexed with tartrates or salicylates and stabilized with a carbonate in an alkaline solution of definite hydroxyl ion concentration, is reduced with formaldehyde to produce a copper plate on a sensitized surface. Although this method produces satisfactory copper plating, the stability of the solution depends on the accurate control of many factors as brought out in the specification. Also the ingredients must be added in a precise order. Furthermore the solutions are rather slow in starting and in plating copper. The present invention overcomes these problems.

In a copending application of Robert M. Lukes, S.N. 725,450, filed concurrently herewith and assigned to the same assignee as the present invention there is disclosed copper plating processes and solutions wherein copper ion is complexed with specific ethyleneaminoacetic acids which can be used to plate copper on sensitized metallic coatings by the use of formaldehyde under controlled pH conditions. In a copending application of Robert M. Lukes, S.N. 725,452, filed concurrently herewith and assigned to the same assignee as the present invention, now U.S. 2,996,408, there are disclosed and claimed copper plating processes and solutions wherein copper ion is complexed with specific alkanol aminoacetic acids which can be used to plate copper on sensitized metallic coatings by the use of formaldehyde under controlled pH conditions. The present invention relates to a similar process except that it uses a different class of complexing agents for the copper ion and produces a brighter copper plate.

It is an object of the present invention to provide new and improved, commercially practical, copper plating solutions and processes for the autocatalytic chemical plating of copper.

Another object of the invention is to provide new and improved copper plating solutions and processes which are capable of plating thick coatings of copper in any desired pattern onto objects having any desired surface configuration or shape.

A still further object of the invention is to provide new and improved chemical copper plating solutions which are relatively stable and which do not decompose spontaneously during the plating action so that a consecutive series of objects may be plated in the solution until the copper is exhausted from the solution.

A still further object of this invention is to provide copper plating solutions and processes which plate only upon pre-selected, sensitized surfaces.

A still further object of this invention is to provide copper plating solutions and processes having the above list of characteristics which do not require elaborate electrical or other equipment for use in conjunction therewith.

These and other objects which will be obvious to those skilled in the art are obtained by the methods described in the following detailed description which should be read with reference to the appended drawings which are graphical presentations of data obtained in connection with the use of my plating solutions. FIGURES 1 to 5 inclusive plot the amount of hydrogen evolved with time with various plating compositions noted in the legends and described further in Example I.

My plating solutions comprise an aqueous solution of formaldehyde containing a complex cupric ion wherein the pH is controlled within a limited range. In forming this aqueous solution, I provide a solution having a pH in the range of 10 to 14 in which a cupric salt is complexed with an alkanolamine having a structural formula:

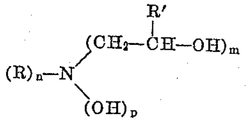

where R is a hydrocarbon radical having from 1 to 10 carbon atoms, R′ is a substituent selected from the group consisting of hydrogen and methyl, $m$ is an integer and is at least 1 and no more than 4, $n$ is an integer and is at least 0 and no more than 3, $p$ is an integer and is at least 0 and not more than 1. The particular values of $m$, $n$, and $p$ must be so chosen that they fulfill the following equation:

$$n+m=3+p$$

Typical of the examples of hydrocarbon radicals that R may be include methyl, ethyl, propyl, butyl, amyl, hexyl, heptyl, octyl, nonyl, decyl, phenyl, tolyl, xylyl, napthyl, ethylphenyl, benzyl, phenethyl, etc. Although R can be larger than 10 carbon atoms, there is no benefit to be obtained by using compounds having R larger than 10 carbon atoms since this is an inactive group as regards my plating solutions. Furthermore, larger hydrocarbon radicals tend to reduce the solubility of the material in aqueous solutions. Preferably, I use compounds containing at least two alkanol groups attached to the amine nitrogen atom and in which R represents a hydrocarbon radical having no more than 4 carbon atoms.

Ordinarily, I produce the desired pH range of 10 to 14 by the use of a metallic hydroxide. The hydroxide, cupric salt and amine complexing agent can be mixed in almost any order desired. For example, the cupric salt can be added to the base to precipitate cupric hydroxide and the desired amine complexing agent added, or the cupric salt and the amine complexing agent can be mixed or both added as a preformed cupric complex and the base added thereafter, or the cupric salt can be added to a mixture of the complexing agent and base.

Almost any base soluble in water capable of producing the desired pH range can be used in my plating solution. The only requirement is that the cation associated with the base must not form a complex more stable than the cupric ion with the amine complexing agent, since, in such a case, the complexing agent must be added in sufficient quantity to not only complex the cupric ion but also to complex the cation of the base. Although this is not deleterious to my plating solution, it is extremely wasteful of the rather expensive complexing agent. Because of this, I prefer to use bases for producing the desired pH range, in my plating solutions whose cation is at most only slightly complexed by the complexing agent. Such metallic cations are conveniently grouped as alkali metals in the periodic system. Therefore, the bases I prefer to use are, for example, lithium, sodium, potassium rubidium, and cesium hydroxides. The alkaline earth metal hydroxides, for example, calcium, barium and strontium hydroxides, can also be used. However, their solubility in water is not as great as the alkali metal hydroxides and their cations form more stable complexes with the complexing agent. Other classes of hydroxides which can be used are the tetraalkylammonium hydroxides, and the tetraalkanolammonium hydroxides such as tetramethylammonium hydroxide, diethyldimethylammonium hydroxide, tetraethylammonium hydroxides, tetraethanolammonium hydroxide, tetrapropanolammonium hydroxide, tetrabutylammonium hydroxide, etc. When an alkanolammonium hydroxide is used as the base it can also serve as the complexing agent.

Any cupric salt can be used providing it is capable of supplying cupric ions to form the complex. Readily available copper salts which I can use are cupric sulfate, cupric nitrate, cupric chloride, cupric acetate, cupric hydroxide, etc., there being nothing critical as regards the anion associated with the copper other than it should not decrease the cupric ion concentration in the solution below the level where it can form the complex as mentioned above. Cupric sulfate represents the lowest cost, most readily available copper salt, and is preferred only for these reasons.

The chemical equation expressing the plating reaction can be written in the following form:

(I)

$$Cu^{++}+4OH^{-}+2HCHO \rightarrow Cu^{0}\downarrow+2HCOO^{-}H_2\uparrow+2H_2O$$

From an examination of this equation, the following facts will be evident to those skilled in the art:

(1) The particular anion associated with the copper and the particular cation associated with the hydroxyl ion are both immaterial as regards to entering into the reaction. However, since the reaction is ionic, the particular anion associated with the copper and the particular cation associated with the hydroxyl group should not be such that they prevent ionization. Stated another way, they should not form such aqueous insoluble compounds that no copper ions or hydroxyl ions are available for reaction.

(2) Under ordinary conditions the cupric ion and the hydroxyl ions would form cupric hydroxide and insoluble compound. A function, therefore, of the complexing agent is to so complex the cupric ion that it cannot react with the hydroxyl ion yet will be available for the reducing action indicated whereby it is reduced to metallic copper.

(3) Hydrogen is a by-product of this reaction and normally will tend to collect on the surface of the article being plated with copper, causing the copper to plate in a spotty and irregular coating. This effect can be minimized by having present in the plating reaction materials known to reduce the surface tension of water, such as alcohols and surfactants.

Although I have tried to use other aldehydes for producing the reducing reaction, I have found that only formaldehyde or formaldehyde engendering agents, for example paraformaldehyde may be used in my plating solutions.

Although not evident from the above equation, the particular complexing agents of this invention provide a further benefit to the plating solution in that they prevent the plating reaction occurring unless a sensitizing metallic surface is also present in the reaction solution. By a sensitizing metallic surface I mean any surface containing a visible or invisible film of metal capable of causing my solution to plate copper. These surfaces can be massive pieces of metal or they can be visible or invisible metallic films present on a non-metallic substrata. It will be evident to those skilled in the art that my plating solution can be used for two purposes; it can be used to copper plate pieces of metal, or it can be used to copper plate non-metallic surfaces. Almost any clean metal surface which is not reactive with alkaline aqueous solutions will act as a sensitizing metallic surface and may be plated with copper by merely bringing the metallic surface in contact with the plating solution. Although metallic surfaces which are reactive with alkaline solutions, can be plated with my solutions, the plate is not smooth and adherent because of the reaction of the metal with the solution to produce hydrogen. Since oils, greases and dirt and other film prevent proper wetting of the metallic surface, they should be removed prior to the plating process unless they are used purposely to mask and prevent plating of certain areas when it is desired to copper plate a controlled area to produce a design or pattern. Typical metals which can be plated include iron, cobalt, nickel, gold, silver, platinum, palladium, rhodium, tin, copper, etc., including alloys such as carbon steels, stainless steels, Monel, the karat golds, sterling and coin silvers, platinum-iridium alloys, etc. It is necessary to provide non-metallic surfaces to be copper plated with my solution with a coating of sensitizing metal. Although any of the above-named metals can be used to form the sensitizing metallic surface, from a practical standpoint, it is only possible to easily provide the non-metallic surface with a sensitizing metal selected from the group consisting of nickel, cobalt, copper, rhodium, silver, gold, platinum, and palladium. It is preferable to roughen the non-metallic surface by either chemical or mechanical means such as chemically etching, roughening by solvent attack, sandpaper, sandblasting, and the like. This roughening process not only removes any invisible film which might prevent the plating of the copper but also enables the sensitized metal and the copper plate to be anchored more firmly and to be more adherent than they would be if this step were omitted. Treating of the roughened surface with a stannous chloride solution followed by washing with water and then treating with a solution of a silver, gold, platinum, rhodium or palladium salt will provide an invisible film on the particular metal used.

The stannous chloride treatment may be omitted if the silver or other noble metal salt is not very soluble in the plating solution. In this case the salt is dissolved in a material which is a good solvent for the salt. This solution is used to treat the surface to be plated. When brought in contact with the plating solution the formaldehyde will reduce the salt to the metal and form a sensitized surface on which the copper will plate. Salts of organic acid such as acetic, propionic, butyric, oleic, palmitic, stearic, naphthenic, benzoic, naphthoic, etc., are ideal for this application. The salts can be dissolved in benzene, toluene, xylene or other suitable organic solvent to form a solution to be used as outlined above. The solutions can be extremely dilute, e.g., 1% by weight of salt and are preferred over more concentrated solutions. Best results are obtained when the solvent for the silver salt also has a slight solvent effect on the material being sensitized. A quick rinse with pure solvent removes the excess silver salt on the surface which will tend to cause a weakly adherent copper plate if not removed. A film of silver or copper may be formed on the metallic surface using the well known "silver mirror" techniques. Metallic films can also be formed by decomposition of metallic hydrides or by vacuum metallizing techniques. Once any of the above metallic coatings have been formed on the non-metallic surface, nickel or cobalt coatings can be formed on the primary metal surface by the method of Brenner and Riddell, "Journal of Research of the National Bureau of Standards," 39, 385–395 (1947), entitled, "Deposition of Nickel and Cobalt by Chemical Reduction." Normally, the additional process step and the expense of providing nickel or cobalt coating do not warrant such a procedure, since a single sensitizing coating gives very satisfactory results. Once the sensitized coating is on the non-metallic surface, either as a visible or invisible film, it can be brought in contact with my plating solution without further treatment to obtain the desired thickness of copper plate.

It will be noticed that copper itself is a sensitizing metal for my plating solution. Therefore, the primary film of sensitizing metal, needed to initiate the plating of copper, can be extremely thin. All that is required of the primary film is for it to form a thin film of copper over the entire desired area. Once this is accomplished, the process is autocatalytic since any copper film will cause additional copper to plate out. As long as the chemical conditions are as specified, the plating reaction continues until either the surface being plated is removed or the copper ion is exhausted from the solution. The autocatalytic nature of the plating reaction permits the object to be removed from the plating solution and examined to determine the thickness and quality of the plate and to clean any areas which might not be plating properly without having the plating reaction continue, thereby wasting the reagents. Furthermore, if copper did not catalyze the reaction, it would be impossible to build up a thick plate of copper without re-sensitizing the surface many times. The ability to form a thick copper plate is a necessary requirement for solutions that are used to produce copper films which must have low electrical resistance and high current carrying capacity without becoming over-heated, for example in the making of printed electrical circuits.

In an alkaline formaldehyde solution, a competing reaction to the plating reaction shown by Equation I occurs and is illustrated by:

$$\text{(II)} \qquad 2Cu^{++}+5OH^{-}+HCHO \rightarrow Cu_2O\downarrow + HCOO^{-}+3H_2O$$

This reaction is non-catalytic and will occur in the absence of sensitizing metals. In the presence of my complexing agent, the reaction is subordinate to the plating reaction, but it is influenced by temperature and the concentration of cupric ions. The cuprous oxide precipitate formed in this reaction is reduced by the alkaline formaldehyde to copper metal, which will initiate the autocatalytic copper plating reaction. Therefore, the stability of my plating solution depends on maintaining the solution free of precipitated copper and cuprous oxide. To insure maximum stability, the minimum quantity of the other ingredients making up my plating bath is dependent on the amount of copper salt used. Excess of the other reagents over that required can be used except for the amount of base which is limited by the requirement that the pH of the solution must be in the range of 10 to 14.

When my complexing agent is a monoamine at least two moles of complexing agent should be present in the plating solution for each mole of copper used. It is believed that the cupric ion forms a complex with my complexing agent which has a typical formula:

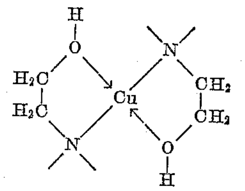

This formula shows the type of complex that would be formed when 2 moles of complexing agent of a monoalkanolamine were reacted with 1 mole of copper. Since the nitrogen atoms may also contain further additional alkanol groups on them, as demonstrated by the formula of my complexing agent, it will be evident that less than 2 moles of complexing agent could be used for each mole of copper. In fact, I have prepared plating solutions in which the ratio is one mole of complexing agent to one mole of copper. However the plating characteristics of such a solution are inferior to the solutions having a ratio of two moles of complexing agent to one mole of copper. When my complexing agent is a diamine, only one mole of complexing agent is required for each mole of copper. However, if there are other competing cations in the solution which also form complexes a greater amount of complexing agent is required, but usually no more than two to three times the above stated amounts of complexing agent needs to be used for each mole of copper.

Because they are readily available, easy to use and do not require excessively large amounts of complexing agent, I prefer to use sodium, potassium or quaternary ammonium hydroxides as the means for obtaining the desired pH range.

As shown by Equation I, the stoichiometrically required amount of base, necessary for the reaction, is four equivalents of base for each mole of copper used. However, in order to maintain the desired pH I may use up to 6 equivalents of base. In addition, any acidity of the formaldehyde must be neutralized. My investigations have shown that it is preferable to use only that amount exceeding 4 equivalents which is necessary to maintain the pH in the lower region of the specified pH range during the plating reaction, rather than to operate in the higher region.

There should be at least two moles of formaldehyde used for each mole of copper, but larger excesses can be used with no deleterious results. However, for economy and ease of controlling the reaction I prefer not to have an extremely large excess of formaldehyde in the solution. The formaldehyde can be added all at once or added stepwise or continuously during the plating reaction.

In addition to the above desired molar proportions of the reactants, I have also found that the rate of formation of the copper plating as well as the length of time the solution is stable without a precipitate forming is dependent upon the molar concentration of copper. Solutions in which the copper concentration exceeds 0.2 M, tend to be unstable, since the rate of the reaction, set forth in Equation II above, becomes significant. Solutions less concentrated than 0.05 M in copper ion, although extremely stable, tend to be rather slow in plating copper. Therefore, I prefer to use solutions in which the copper ion concentration falls within the range of 0.05 to 0.2 M. Solutions approximately 0.1 M in cupric ion concentration provide the optimum concentration wherein the speed of plating and solution stability are both satisfactory for providing commercially acceptable plating solutions.

Several methods are available for lengthening the solution life, one of which is to remove the precipitated cuprous oxide or copper by continuously filtering the solution to remove the precipitate. Reducing the temperature of the plating solution increases the solution life. Another method is to continuously bubble air or other oxygen-containing gas through the solution. This latter process is disclosed and claimed in my copending application, S.N. 725,451, filed concurrently herewith and assigned to the same assignee as the present invention, now U.S. 2,938,805. By this method, the bubbling of a fine stream of oxygen-containing gas through a well agitated solution is capable of increasing the life of the solution for at least 3 or 4 times and usually 30 to 40 times its normal life.

For a given solution the total rate at which copper is deposited is directly proportional to the catalytic surface area. Therefore, it is advantageous to plate on as large an area as possible per volume of plating solution. This depletes the solution of copper before serious decomposition occurs and increases the volume efficiency. This is an especially useful technique therefore, to use with the more concentrated plating solutions.

The plating rate is affected not only by cupric ion concentration and the ratio of catalytic surface area to volume of solution, but also by the temperature of the solution. As the temperature is increased the plating rate also increases. Unfortunately the decomposition reaction to form cuprous oxide also increases with temperature. Therefore, for best results I prefer not to have the temperature of my plating solutions exceed 50° C. and usually not to exceed 35 C. The temperature can be as low as the freezing point of the solution, but I have not found any benefit to be gained by operating at such low temperatures. Normally I prefer to have the temperature no lower than 10° C. and usually no lower than 15° C. Completely satisfactory results are obtained by operating at ambient temperature, e.g., 20–30° C. When using large volumes of plating solution, the exothermic nature of the plating reaction produces enough heat that it is sometimes necessary to cool the solution, e.g., with cooling coils through which cold water or refrigerant is circulating.

When operating at ambient temperature (20–30° C.) with plating solutions containing cupric ion in the range of 0.05 to 0.2 molar and the amount of copper in solution is in large excess of that plated out, I will obtain plating rates in the range of 0.05 to 0.5 mil per hour. The final thickness I can obtain is not limited by the ability of my solutions to produce a thicker coat, but by the practical aspect that, if the coefficients of expansion of the copper and substrate are not matched, an extremely thick plate of copper (e.g., 10 mils or thicker) will pull away from the subtrate if subjected to repeated heating and cooling cycles. Normally I have found 3–4 mil copper coatings to be thick enough for all practical applications although thicker coatings can be produced.

As will be evident there must be at least as much copper in solution as is required to plate the desired area with a desired thickness. The minimum volume of solution required to produce a desired thickness is a function of the cupric ion concentration. When using low copper concentrations, or the stabilizing technique of bubbling air through the solution, it is possible to use large volumes of carrying out the plating of one batch or articles until the desired thickness of copper is attained, and then adding subsequent batches of articles to be plated.

A wetting agent improves the quality of the copper plate laid down, since it reduces the size of the hydrogen bubbles given off and facilitates the maximum penetration of the plating solution into the cracks and crevices of the substrate. Almost any surfactant can be used, such as for example, the non-ionic, the quaternary ammonium salt, the alkyl phenol sulfonate, and the alkyl sulfate types of surfactants. Sodium lauryl sulfate is a relatively inexpensive, easily available material which I have found particularly useful.

For best operation of plating bath, agitation and filtration are highly desirable. Agitation, in addition to maintaining uniform concentration, helps to detach the hydrogen bubbles from the surface being plated, thereby giving a better quality of plate and preventing copper streaking of the areas where plating is undesired.

Filtration removes the loose copper particles from the solution and thereby minimizes solution decomposition and extraneous plating. Some of the loose copper particles probably are caused by copper being torn from the surface by the evolved hydrogen gas. This is particularly noticeable when concentrated plating solutions are used.

In practice, filtration and agitation can be combined. A pump circulates the solution through a filter and this creates sufficient stirring of the plating bath.

Since the copper plate laid down by my process has only a mechanical bond to the non-metallic substratum, the adhesion is a function of the roughness and wettability of the surface of the plating solution. Consequently, adhesion to a polished or extremely hydrophobic surface which is repellent to the plating solution is nil, while adhesion to a porous, rough, wettable surface is very good.

In practice, for non-metallic substrate, comprising a shaped article containing (1) a synthetic resin such as a laminated or molded phenolic, urea, melamine, alkyd, silicone, ethanoid and so forth, resins, or (2) a high-gloss surface such as glass glazed ceramic and the like, a light sand blast before sensitization provides excellent adhesion. In those cases where silicone resins are present, an alkali soak (e.g., in a 5% aqueous sodium or potassium hydroxide solution) has proved desirable before sensitizing the surface with a metal film. Porous material such as unglazed ceramics, require no surface preparation before sensitization other than to insure that they are clean and wettable by the plating solution. The degree of adhesion obtained on non-metallic surfaces is apparently dependent also on the ease with which the surface is wetted by the plating solution. Those surfaces containing materials which easily absorb water such as cellulose fibers, form very strong bonds with the copper plate.

Selectivity is the ability to plate where it is desired, while not plating areas where it is not desired. This can be achieved in two ways: (1) only the areas to be plated are sensitized, (2) the whole item is sensitized, and the areas not to be plated are masked with a resist. The latter method is easier to accomplish and is more reproducible. Silk screen technique can be used to readily mask intricate designs or patterns on the surface. A solution of polystyrene in toluene or xylene gives exceptionally good results when used to make the resist. It may be thickened and colored by incorporating solid pigments, soluble dyes and well-known fillers used in plastic and paint manufacture, e.g., carbon black, silica, lithopone, titanium dioxide, zinc chromate, zinc oxide, lead oxide, iron oxide, etc. Not only is it water-repellent and alkali resistant, but it is easily removed when desired. Most polyester resins, nitrocellulose lacquers, and polyvinyl alcohol are too readily penetrated by the highly alkaline solution to function satisfactorily as resists. In order that those skilled in the art may better understand how my invention may be carried into effect, the following examples, carried out at the ambient temperature, are given by way of illustration and not by way of limitation.

*Example 1*

The purpose of this example is to illustrate some of the variables of my process and their effect on the speed of plating. In carrying out this example solutions were made up to the concentrations shown on the legends of the FIGURES 1–5 of the drawings forming a part of this specification and the volume of hydrogen given off during the plating action was collected and measured. The plating action was initiated by introducing a clean copper surface. The volumes of hydrogen collected were measured at 25° C. and atmospheric pressure, but are not corrected to STP conditions. The purpose of this example is to show fairly large differences rather than to illustrate optimum results obtained with the reagents used. Quality of plate and stability of the plating solutions are not direct or related functions of plating speed.

Figure 2:
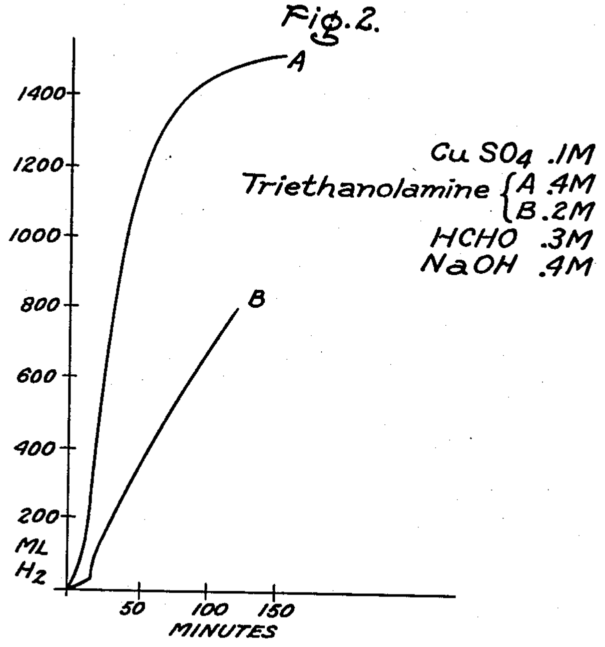
Figure 3:
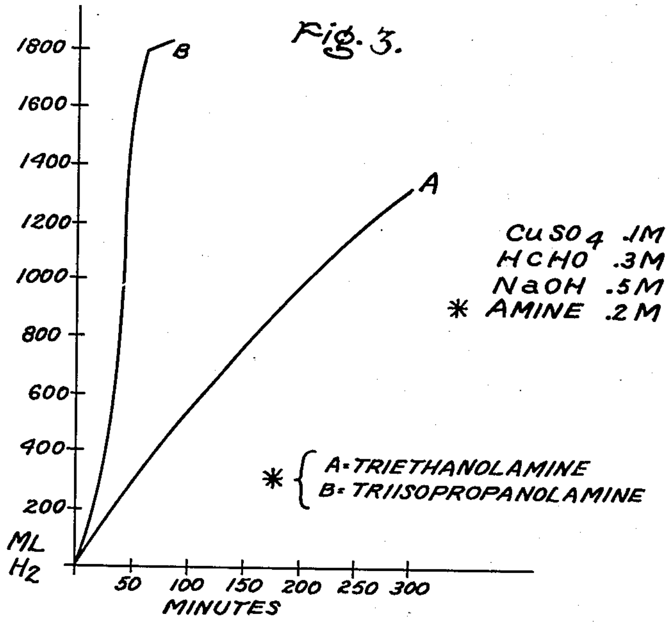
Figure 4:
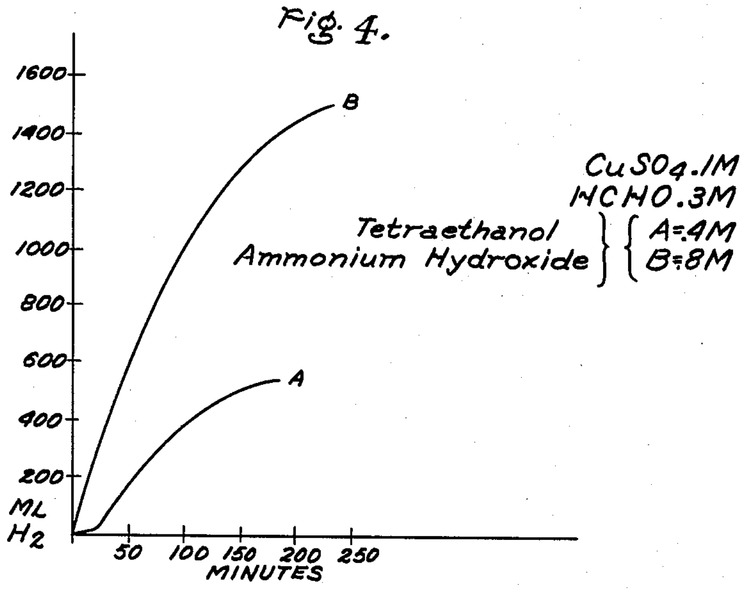
Figure 5:
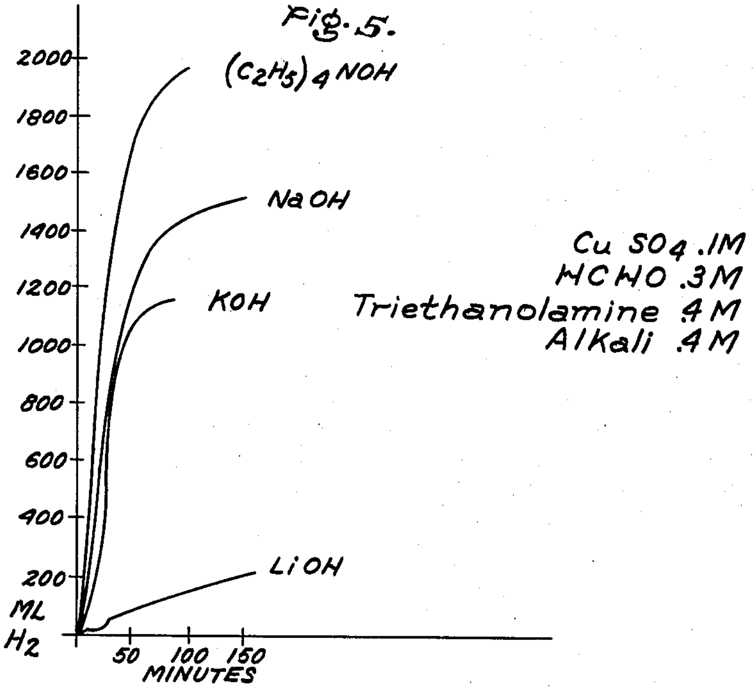

Referring now to the figures of the drawings, FIG. 1 shows how the plating rate is dependent on the alkali concentration. It illustrates that an excess amount of base has a retarding effect on the plating rate. FIG. 2 illustrates how the plating rate obtained in FIG. 1 is also dependent on the concentration of the complexing agent. An excess over the theoretical amount has a beneficial effect on plating rate. FIG. 3 shows that different plating rates are obtained with different complexing agents, even though they are similar in chemical structure and used at equal concentration. FIG. 4 illustrates the use of a compound which can act not only as the complexing agent, but also as the source of hydroxyl ion concentration for producing the desired pH of the solution. Also it illustrates again the effect of hydroxyl ion concentration. In this case, it should be remembered that 0.2 mole of the tetraethanol ammonium hydroxide is required to complex the cupric ion and therefore, curve A shows the effect of a deficiency of base. FIG. 5 shows the effect of various bases on the plating rate.

*Example 2*

The following ingredients were dissolved in water to make 1 liter of solution having the stated concentration of reagents:

| | Molarity |
|---|---|
| Cupric sulfate | 0.1 |
| Complexing agent | 0.2 |
| Sodium hydroxide | 0.6 |
| Formaldehyde | 0.3 |

The following list of amines were used individually as the complexing agent in making up otherwise duplicate solutions.

Triethanolamine $N(CH_2CH_2OH)_3$

N,N-diethyl-ethanolamine $(C_2H_5)_2N(CH_2CH_2OH)$

N,N-dimethyl-ethanolamine $(CH_3)_2N(CH_2CH_2OH)$

N-methyl-diethanolamine $CH_3{-}N(CH_2CH_2OH)_2$

Triisopropanol amine $N(CH_2{-}CH(CH_3)OH)_3$

Tetraethanolammonium hydroxide $$HO{-}N(CH_2CH_2OH)_4$$

N-butyl-diethanolamine $C_4H_9{-}N(CH_2CH_2OH)_2$

Pieces of phenolic-resin, paper-base laminate which had been lightly sandblasted were dipped for one minute into a stannous chloride solution prepared by dissolving 10 grams of stannous chloride and 20 milliliters of 12 molar hydrochloric acid in water to make one liter. After removal they were rinsed in running water, and dipped for 1 minute in a palladium chloride solution made by dissolving ½ gram palladium chloride in 10 milliliters of 12 molar hydrochloric acid and diluted with water to make 1 liter. After removal from the palladium chloride, the samples of the laminate were rinsed with running water and individual pieces placed in the above copper plating solutions. Hydrogen gas was evolved slowly and copper was deposited over the entire sensitized surface of the phenolic laminates to produce a very bright copper plate.

Those plating solutions containing a tetraalkanolammonium hydroxide such as tetraethanolammonium hydroxide and a tetraalkylammonium hydroxide such as tetraethylammonium hydroxide appear to show greater stability and longer life than those containing sodium hydroxide. In addition to the phenolic-resin, paper-base laminate, I have successfully copper plated other synthetic resins including an ethylene glycolterephthalate resin film, molded wood flour-filled phenolic resins, epoxy resin laminates, monofilament nylon, paper, glass, glass wool, stainless steel, nickel, glass-bonded mica, porcelain, barium titanate, a thermistor comprising mixed metallic oxides, human hair, etc. by using the above described solutions.

Because my solutions are alkaline, paraformaldehyde will readily dissolve in my solutions and is therefore satisfactory to be used in place of formaldehyde. In addition to using palladium chloride for forming the sensitized metallic coating, I have used gold chloride and silver nitrate. I have also produced sensitized surfaces by treating the non-metallic surface with a colloidal suspension of palladium. Since the function of the stannous chloride solution is only to cause reduction of the noble metal salt to the metal, other known reducing agents or methods may be used. I have sensitized metallic surfaces by treating them with palladium chloride which was subsequently decomposed by heating to a temperature of 150° C. Other methods of producing sensitized coatings which I may use are disclosed in the above mentioned applications of Lukes and Cahill.

When non-metallic boards having holes punched therein, are plated using my plating solutions it is found that the copper plates on all the unmasked sensitized surfaces, including the walls of the holes, and does not build up at the sharp edges, my solutions can be used, therefore, to produce printed circuits whereby electrical contact is desired between two surfaces.

From the foregoing description, it can be seen that the present invention provides commercially practicable chemical copper plating solutions and processes for the chemical plating of copper onto catalytically reactive metallic surfaces or onto non-metallic materials which have been sensitized with a visible or invisible film of metal. By means of this invention, relatively thick coatings of copper may be plated on the surfaces. However, should it be desired to do so, once the copper coating has been formed, the standard electroplating procedure can be used to plate additional copper.

The above examples have illustrated many of the modifications and variations of the present invention, but obviously other modifications and variations are possible in the light of the above teaching. Therefore, it is to be understood that changes may be made in the particular embodiments of the invention described which are within the full intended scope of the invention as defined by the appended claims.

What I claim as new and desire to secure by Letters Patent of the United States is:

1. A solution for autocatalytically plating copper onto an active metallic surface which comprises an aqueous solution having a pH in the range of 10 to 14 having dissolved therein formaldehyde and a cupric ion complex of an amine having the formula:

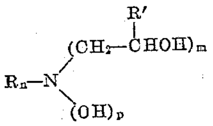

wherein $m$ is an integer that is at least 1 and no more than 4, $p$ is an integer and is at least 0 and no more than 1, $n$ is an integer and is at least 0 and no more than 3, the sum of $m+n$ equals $3+p$, R is a hydrocarbon radical having from 1 to 10 carbon atoms.

2. The solution as in claim 1 wherein the cupric ion is complexed with triethanol amine.

3. The solution as in claim 1 wherein the cupric ion is complexed with N-methyldiethanolamine.

4. The solution as in claim 1 wherein the cupric ion is complexed with tetraethanolammonium hydroxide.

5. The solution in claim 1 wherein the cupric ion is complexed with triisopropanolamine.

6. The solution as in claim 1 wherein the pH of the aqueous solution is obtained by using a base selected from the group consisting of sodium hydroxide, potassium hydroxide, tetraalkanolammonium hydroxides, and tetraalkylammonium hydroxides.

7. The solution as in claim 6 wherein the base is a tetraalkanolammonium hydroxide.

8. The solution as in claim 6 wherein the base is a tetraethanolammonium hydroxide.

9. The solution as in claim 6 wherein the base is a tetraalkylammonium hydroxide.

10. The solution as in claim 6 wherein the base is a tetraethylammonium hydroxide.

11. The solution as in claim 6 wherein the base is sodium hydroxide.

12. The solution as in claim 1 wherein the copper is present in the concentration of from 0.05 to 0.2 molar.

13. The solution as in claim 1 wherein the cupric ion is complexed with triethanolamine and the pH of the solution is obtained by using tetraethylammonium hydroxide.

14. The solution as in claim 1 wherein the cupric ion is complexed with N-methyldiethanolamine and the pH of the solution is obtained by using sodium hydroxide.

15. The process of autocatalytically plating copper which comprises contacting an active metallic surface with the solution of claim 1.

16. The process of autocatalytically plating copper onto a non-metallic substratum which comprises forming a film of a metal selected from the group consisting of nickel, cobalt, copper, silver, rhodium, gold, platinum, and palladium on the surface of the non-metallic body, and thereafter contacting the sensitized non-metal with the solution of claim 1.

References Cited in the file of this patent

UNITED STATES PATENTS

| | | |
|---|---|---|
| 2,475,974 | Max | July 12, 1949 |
| 2,482,354 | Max et al. | Sept. 20, 1949 |
| 2,602,757 | Kantrowitz et al. | July 3, 1952 |
| 2,759,845 | Hilemn | Aug. 21, 1956 |
| 2,836,566 | Duncan | May 27, 1958 |
| 2,871,139 | Wein | Jan. 27, 1959 |

FOREIGN PATENTS

| | | |
|---|---|---|
| 604,644 | Great Britain | July 7, 1948 |

OTHER REFERENCES

Marboe et al.: The Glass Industry, vol. 26, No. 3, March 1945, pp. 119, 120, 136–138, 142, 149.

UNITED STATES PATENT OFFICE

CERTIFICATE OF CORRECTION

Patent No. 3,075,855 January 29, 1963

Maynard C. Agens

It is hereby certified that error appears in the above numbered patent requiring correction and that the said Letters Patent should read as corrected below.

Column 11, line 13, after "atoms" insert -- , and R' is a member of the group consisting of hydrogen and methyl --.

Signed and sealed this 28th day of April 1964.

(SEAL)
Attest:

ERNEST W. SWIDER
Attesting Officer

EDWARD J. BRENNER
Commissioner of Patents